United States Patent [19]

Noble et al.

[11] 4,065,370

[45] Dec. 27, 1977

[54] METHOD OF ION PLATING A THIN METALLIC STRIP FOR FLASHLAMP STARTING

[75] Inventors: Lowell Noble, Monte Sereno; James T. Gaspar, San Jose, both of Calif.

[73] Assignee: The United States of America as represented by the Secretary of the Army, Washington, D.C.

[21] Appl. No.: 763,438

[22] Filed: Jan. 28, 1977

Related U.S. Application Data

[63] Continuation-in-part of Ser. No. 663,058, Nov. 18, 1975, abandoned.

[51] Int. Cl.² ............................................. C23C 15/00
[52] U.S. Cl. .............................. 204/192 N; 313/198; 313/201; 331/94.5 G; 331/94.5 PE; 331/94.5 T
[58] Field of Search ................... 204/192 N; 313/198, 313/201; 331/94.5 G, 94.5 PE, 94.5 T

[56] References Cited

U.S. PATENT DOCUMENTS

| 3,688,217 | 8/1972 | Witte et al. | 331/94.5 |
|---|---|---|---|
| 3,792,372 | 2/1974 | Mark | 331/94.5 |
| 3,882,417 | 5/1975 | Wood et al. | 331/94.5 T |

*Primary Examiner*—John H. Mack
*Assistant Examiner*—Aaron Weisstuch
*Attorney, Agent, or Firm*—Nathan Edelberg; Sheldon Kanars; Daniel Sharp

[57] ABSTRACT

A method of insuring efficient triggering of a laser flashlamp by ion plating to the outer surface of the quartz envelope of the flashlamp and an elongated thin electrically conductive strip which consists of an underlying thin layer of silver coated with a thin layer of nickel.

3 Claims, 4 Drawing Figures

U.S. Patent      Dec. 27, 1977      4,065,370
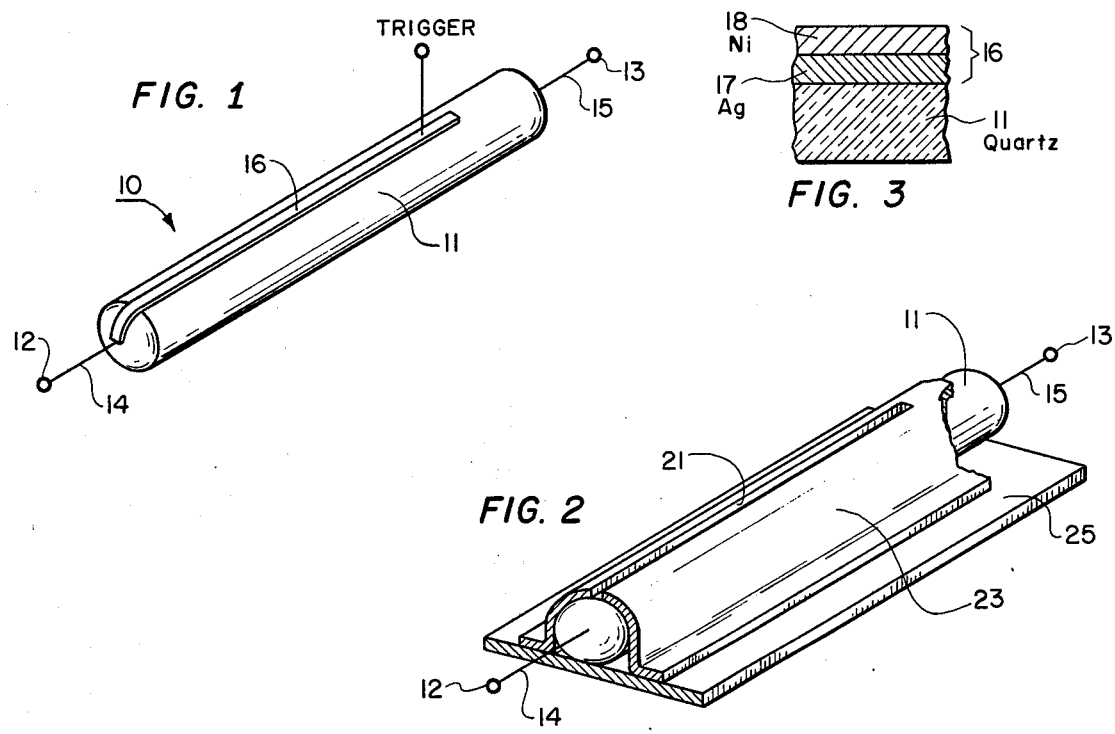
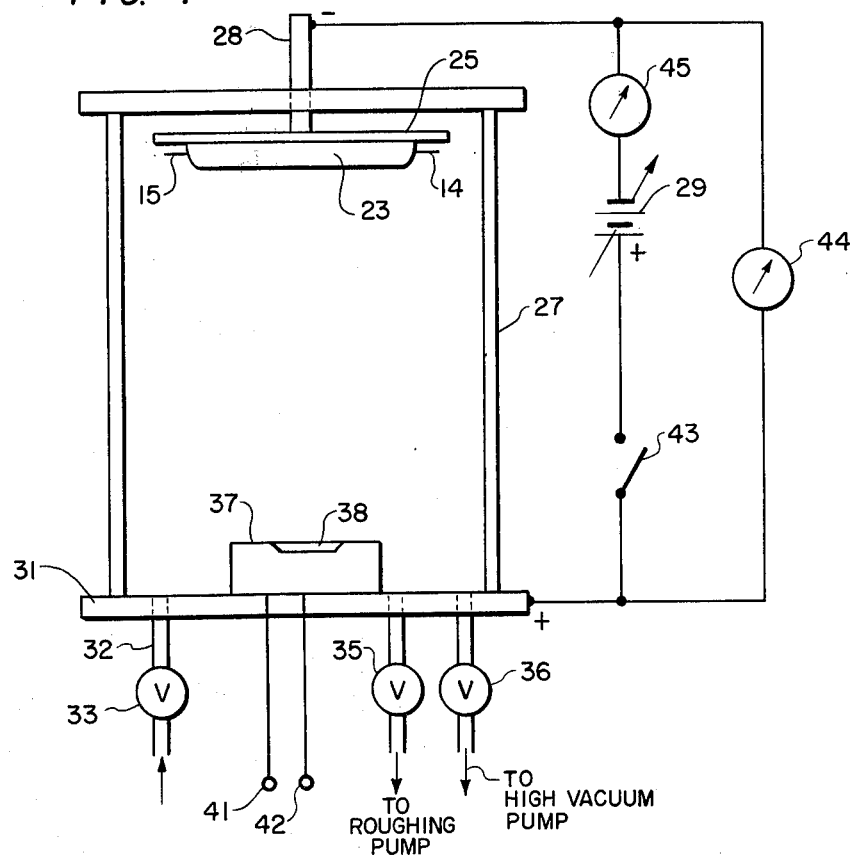

METHOD OF ION PLATING A THIN METALLIC STRIP FOR FLASHLAMP STARTING

The invention described herein may be manufactured, used and licensed by or for governmental purposes without payment to us of any royalties thereon The invention is a continuation-in-part of copending application of Lowell Noble and James Gaspar, Ser. No. 633,058 entitled "Thin Metallic Strip for Flashlamp Starting," filed Nov. 18, 1975 now abandoned.

The invention described herein may be manufactured, used and licensed by or for governmental purposes without payment to us of any royalties thereon.

BACKGROUND OF THE INVENTION

Prior attempts to trigger laser flashlamps have been accompanied by technical disadvantages; for example, if the flashlamp is wrapped with a trigger coil, an initially spiral or stepped arc is produced in the flashlamp with the plasma following the placement of the trigger coil around and along the flashlamp. Moreover, if the coil turns are too closely spaced, the luminous flux emanating from the flashlamp is interfered with. Moreover, if a linear strip is painted onto the flashlamp surface, the strip disintegrates after a very brief pulsing period.

SUMMARY OF THE INVENTION

In accordance with the invention, an efficient linear discharge is produced within the flashlamp by ion plating a thin linear strip of silver on the outer surface of the flashlamp, followed by ion plating a thin strip of nickel over the deposited thin elongated silver strip.

A BRIEF DESCRIPTION OF THE DRAWINGS

FIG. 1 is a view illustrating a flashlamp on which is deposited a composite strip serving as a trigger electrode by means shown in FIG. 4;

FIG. 2 is a view showing the manner in which the lamp is mounted for ion plating accomplished by the means shown in FIG. 4;

FIG. 3 is an enlarged view, in transverse cross section, of a portion of the composite strip electrode shown in FIG. 1; and FIG. 4 is an illustration of equipment suitable for applying the composite layer to the flashlamp envelope.

DESCRIPTION OF THE PREFERRED EMBODIMENT

Referring to the drawing, a flashlamp 10 is shown in FIG. 1 which includes an envelope 11 containing an ionizable gas such as xenon under pressure and having the usual internal electrodes defining therebetween an arc gap. Appropriate potentials are applied to terminals 12 and 13, connected by way of leads 14 and 15 to said electrodes, for pre-ionizing the gas within the flashlamp. A linear trigger electrode 16, shown in FIG. 1, is to be permanently bonded to the outer surface of the flashlamp envelope 11. As explained later, the composite-layered trigger electrode 16 includes an underlying layer 17 of silver coated with a layer 18 of nickel. See FIG. 3.

As shown in FIGS. 2 and 4, the flashlamp 10 is positioned within a metal lamp holder 23 which is attached to a metal mounting plate 25. As indicated in FIG. 2, the lamp holder 23 includes an elongated aperture 21 of a required configuration of the trigger electrode 16 of FIG. 1; this apertured electrically conductive holder serves as a masking fixture to limit exposure of the flashlamp envelope to the ionized silver and nickel to the region underlying the aperture 21. Both the metal mounting plate 25 and lamp holder 23 serve as a grid cage around the electrically insulating lamp envelope, causing an increase in the number of ions and permitting coating, by ion plating, of the electrical insulator (envelope) 11 without use of radio frequency energy.

After carefully cleaning the flashlamp 10 with, for example, isopropyl alcohol, the flashlamp, with surrounding holder 23 and mounting plate 25 is positioned within the evacuated chamber or bell jar 27. The mounting plate includes a tubular extension 28 which passes through the top of the bell jar 27 and serves as the negative terminal for the high voltage supply 29. The positive terminal of the power supply is connected directly to the base plate 31 of the bell jar 27. The power supply 29 is indicated as variable and the voltage level is indicated by voltmeter 44.

An inlet connection 32 and valve 33 are provided to allow for introduction of argon vapor into the bell jar, while the vacuum within the bell jar is controlled by valves 35 and 36 which are connected in lines leading to a roughing pump and high vacuum pump, respectively, not shown in FIG. 4.

As shown in FIG. 4, by way of example, the material 38 (nickel and silver) to be deposited on the flashlamp 10 can be disposed in separate compartments in a receptacle 37 mounted on base plate 31 and heated by separate heaters, not shown in FIG. 4, embedded in receptacle 37 and connected by way of terminals 41 and 42 to an appropriate heater supply. Alternatively, applicants incorporate the silver and nickel into filaments which are embedded in the receptacle 37 and heated directly (and separately) from the aforesaid heater supply. One filament, for example, comprises 5 grams of 0.010 inch silver wire wrapped over a U-shaped tungsten 0.050 inch wire core, while the other filament, for example, comprises 15 grams of 0.015 inch nickel wire wrapped about a similar tungsten wire core.

To initiate the ion plating process, the roughing pump valve 35 is opened until the bell jar 27 is evacuated to less than 10 microns of mercury, after which valve 35 is closed. The high vacuum valve 36 now is opened slowly, keeping the high vacuum pump pressure at less than $2 \times 10^{-5}$ millimeters of mercury. After the bell jar pressure reaches $5 \times 10^{-6}$ millimeters, the filaments are turned on for out-gassing and kept on until the chamber pressure has recovered to $5 \times 10^{-6}$ millimeters. The filaments are turned off and the high vacuum valve 36 is closed. The roughing pump valve 35 is now reopened and the needle valve 33 opened to highly pure argon gas. The bell jar pressure is raised to about 20 microns of mercury and maintained by balancing the amount of argon admitted to the bell jar and the amount by which the roughing valve is open to the roughing pump. The high voltage power supply is turned on by switch 43 with the voltage set at zero. See the electrical connections of FIG. 4. The voltage level is increased to 4KV as indicated by voltmeter 44, and the argon valve 33 and/or roughing valve 35 adjusted to control the amount of current drawn to approximately 100mA, as indicated by the milliameter 45. The current density is now such as to produce a cleaning or scrubbing action on the exposed surface of the mounted flashlamp 10. This condition of 4KV and 100mA is maintained for about 30 minutes for sputter cleaning of the lamp and holder. The argon flow rate is now decreased until, with a high voltage of 4KV, the current flow is 50mA. The silver filament is heated until the silver wire is melted; the above power supply readings should be monitored so that the current density is kept sufficiently low to prevent the silver from being sputtered off. When about 90 percent of the silver has been evaporated into the argon plasma around the lamp and a layer of silver of at least 5000 Angstrom units thick is affixedly bonded to the flashlamp, the silver filament is turned off and the nickel filament evaporated in the same manner as for the silver filament until a layer of at least 5000 Angstrom units thick is securely bonded to the silver layer. Care must be taken that both filaments are evaporated at the fastest rate possible without filament burnthrough. When the nickel filament is turned off, the high voltage supply is turned off by opening switch 43. Argon flow is then adjusted to keep the chamber pressure at approximately 20 microns of mercury to facilitate cooling of the lamp and bell jar. After the chamber has reached room temperature, the roughing valve 35 is closed and, once the chamber pressure and room pressure have equalized, the flashlamp 10 can be removed from the bell jar 27 and the argon valve 33 closed; the coated flashlamp is then removed from the masking fixture shown in FIG. 2. The composite layer 15 must be sufficiently massive to carry the trigger current which flows through the trigger electrode 15, but not so thick as to cause peeling of the composite layer 15 owing to the differences in thermal coefficient and expansion of the conjoined materials. The silver layer 17 is an excellent current conductor, while the nickel layer 18, in addition to being a relatively good current conductor, prevents the silver layer from being oxidized. The resulting elongated trigger electrode 16 indicated in cross section in FIG. 3, plated onto the outer surface of the envelope 11 of flashlamp 10 is bonded securely to the substrate, viz, the quartz envelope 11 of the flashlamp 10.

What is claimed is:

1. A method of insuring triggering of a laser flashlamp by application of an electrical impulse to an elongated metal strip permanently affixed to the outer surface of the quartz envelope of said flashlamp, comprising the steps of forming said metal strip by masking said flashlamp envelope to leave exposed an elongated region of said envelope, ion plating onto said exposed region of said envelope a thin layer of silver, and ion plating onto said plated layer of silver a thin layer of nickel.

2. The method of claim 1 wherein each of said layers has a thickness of at least 5000 Angstrom units.

3. The method of claim 1 wherein said ion plating steps include evaporating said layer material in a partially evacuated enclosure, ionizing said evaporated material in an inert gas plasma created by high voltage discharge into said gas and accelerating said ionized material to said flashlamp by the high voltage created within said enclosure between said flashlamp and said enclosure.

* * * * *